United States Patent [19]

Kumar et al.

[11] Patent Number: 5,231,590

[45] Date of Patent: Jul. 27, 1993

[54] TECHNIQUE FOR MODIFYING AN INTEGRATED CIRCUIT LAYOUT

[75] Inventors: Niraj Kumar, Fremont; Jean P. Meunier, Los Gatos, both of Calif.

[73] Assignee: Zilog, Inc., Campbell, Calif.

[21] Appl. No.: 420,912

[22] Filed: Oct. 13, 1989

[51] Int. Cl.$^5$ ............................................ G06F 15/60
[52] U.S. Cl. ................................. 364/491; 364/490;
364/489; 364/488
[58] Field of Search ............... 364/488, 489, 490, 491,
364/578; 395/100, 140, 141

[56] References Cited

U.S. PATENT DOCUMENTS

| | | | |
|---|---|---|---|
| 4,805,113 | 2/1989 | Ishii et al. | 364/491 |
| 4,813,013 | 3/1989 | Dunn | 364/488 |
| 4,831,543 | 5/1989 | Mastellone | 364/489 |
| 4,922,432 | 5/1990 | Kobayashi et al. | 364/490 |
| 4,967,367 | 10/1990 | Piednoir | 364/490 |

*Primary Examiner*—Vincent N. Trans

*Attorney, Agent, or Firm*—Majestic, Parsons, Siebert & Hsue

[57] ABSTRACT

An existing integrated circuit layout is modified or revised in order to shrink it, update it, modify it for merger with another circuit on a single chip, or the like, in a manner which assures, prior to implementing the modified layout in an integrated circuit chip, that the electronic circuit implemented by it has not inadvertently been modified in the process. Data of the existing layout is first run on a net list extractor computer software program in order to determine its net list. After the layout is modified by usual computer techniques, the modified layout data is run on the extractor program to obtain another net list, and the net lists are then compared for any undesired differences. Once the modified layout has been determined to be free of any such differences, a set of masks are made from the modified database. The masks are used then used to manufacture the integrated circuit.

6 Claims, 3 Drawing Sheets

TECHNIQUE FOR MODIFYING AN INTEGRATED CIRCUIT LAYOUT

BACKGROUND OF THE INVENTION

This invention relates generally to techniques of integrated electronic circuit design, and particularly to a process of modifying or revising an existing integrated circuit layout.

The steps required in order to design masks used to form the various layers on an integrated electronic circuit are many. The first major step, after defining what the circuit is to do, is to prepare a schematic diagram showing all of the circuit elements and their interconnections. The function of the circuit is then tested by computer simulation of expected operating conditions. In the course of such testing, a net list of the circuit schematic is developed. A net list describes the schematic diagram by assigning a unique number to each digital logic gate or other circuit component, and a separate identification for each terminal of the component. The schematic diagram is then expressed as a net list of interconnections among the identified gate terminals and input/output points of the circuit.

The schematic circuit is then converted to a circuit layout by designing a number of masks which, when used to make an integrated circuit chip, implements the circuit initially designed as a schematic diagram. This is accomplished by a layout designer with the help of sophisticated computer programs. When the designer has completed the layout work, a net list is extracted from the resulting layout computer data by a commercially available net list extraction computer software program. This net list is then compared with the original schematic net list as a check on whether the layout was done properly. This comparison is accomplished by a commercially available net list comparison computer software program which gives an output that identifies the differences in the net list. The layout designer can then use a layout editing computer software program to modify the layout database in order to eliminate any differences. The process identifies mask layout errors without first having to make an actual integrated circuit.

Recently, integrated circuit manufacturers have found it necessary to modify the layout of a circuit product wherein the schematic diagram is unavailable. This can occur due to some error in maintaining records but more often occurs when rights to the circuit design are acquired from another and the layout database is all that is provided about the product. Modifications of the layout, under these circumstances, are done very carefully since there is no schematic diagram with which to compare the resulting modified layout in order to confirm that the circuit schematic being implemented has not changed. This is very time consuming and any errors that might occur when the layout is modified will not be identified until the circuit is actually formed, an expensive process. Some have manually reconstructed the schematic diagram from the layout database in order to have something with which the modified layout can be verified but this also is a very labor intensive and expensive process. These disadvantages have limited the number and complexity of layout editing that is performed when the schematic is not available.

Therefore, it is a primary object of the present invention to provide an improved technique for determining whether editing of a layout database has inadvertently caused the underlying circuit to be modified.

It is another object of the present invention to provide such a technique that is simple, less time consuming and less costly than the aforementioned alternative layout verification techniques.

SUMMARY OF THE INVENTION

These and additional objects are accomplished by the present invention wherein, briefly and generally, an existing integrated circuit layout computer database is initially run through a net list extractor computer software program to obtain a net list of the electronic circuit that is implemented by the layout. After the layout database is modified, the modified database is run through the same extractor program to obtain a net list of the circuit of the modified layout. These net lists are then compared by the use of available computer software. If there are any differences in the net lists, then the layout designer proceeds to edit the layout database to correct the errors that were made in the original modification of the database. After editing, a net list of the edited modified layout is then compared with the original net list. If any errors remain, the layout may be again edited, the net list compared and so on. This technique results in verification that a modified circuit layout still implements the same circuit functions as did the original layout, in an efficient and cost effective manner.

Additional objects, advantages and features of the present invention will become apparent from the following description of its preferred embodiment, which description should be taken in conjunction with the accompanying drawings.

DESCRIPTION OF A PREFERRED EMBODIMENT

Figure 1A:
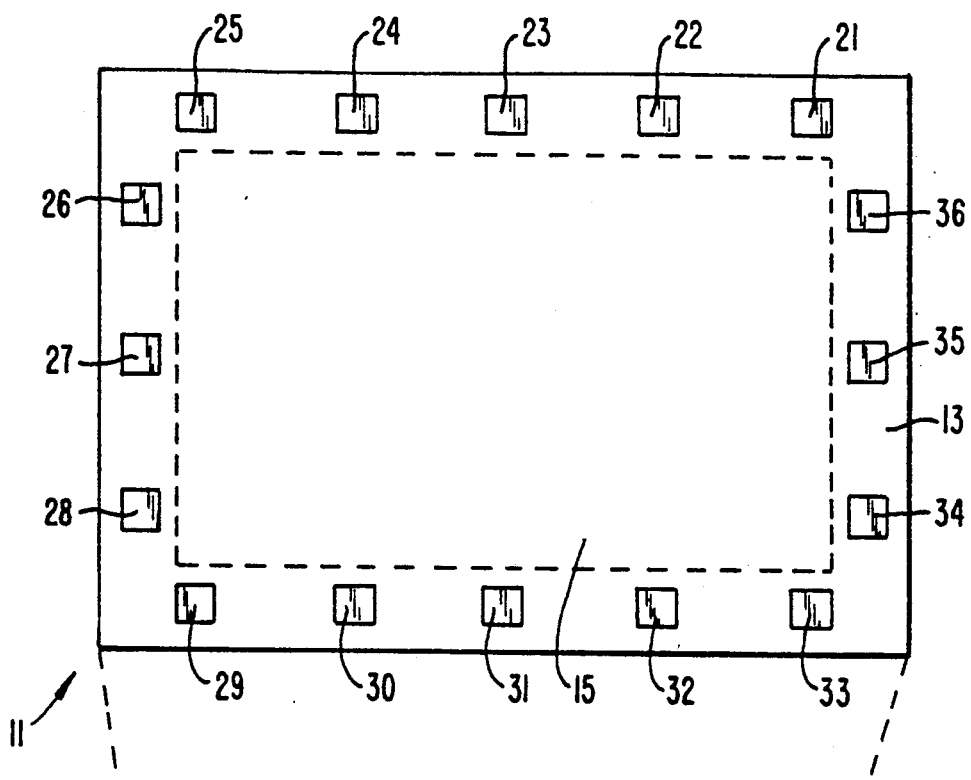
FIG. 1A illustrates an example integrated circuit chip layout which is to be modified.

In order to illustrate the techniques of the present invention, an example digital integrated circuit layout is outlined in FIG. 1A. An integrated circuit chip 11 can function as a microprocessor, as one of many types of computer peripheral chips, as a digital memory, and the like. The techniques being described are not limited to any particular type of digital circuit. The layout of the chip 11 can be considered to have two major components. A first component 13 is a pad ring, a region around the outside perimeter of the chip that includes a plurality of connection pads 21-36. A major portion of the operating circuit is contained in a region 15 in the middle of the chip layout. Of course, the size of the layout, number of connection pads, and similar physical characteristics, will vary considerably from chip to chip, depending upon its function, purpose and complexity.

A common instance where an existing circuit layout needs to be changed is when the overall size of the integrated circuit chip is being shrunk. Reduction in the size of integrated circuit chips has been an ongoing process in the semiconductor industry since its beginning and will likely be so far into the future. Of course, the smaller individual chips can be made, the more of them that can be processed at one time on a single semiconductor wafer. As semiconductor processing technology has steadily improved to increase the resolution with which the integrated circuits can be made, existing circuit layouts are periodically reduced in size.

Figure 1B:
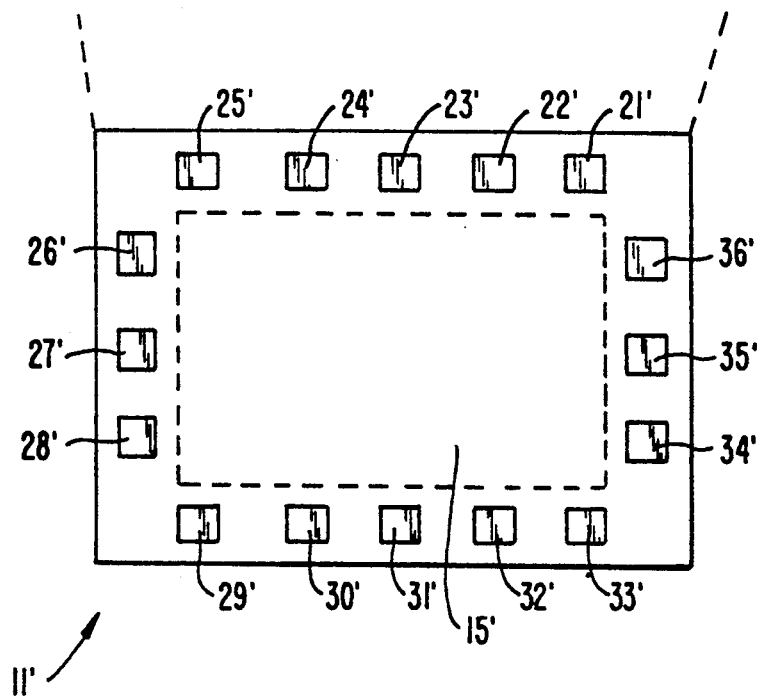
FIG. 1B illustrates an example modified integrated circuit layout of FIG. 1A.

Such a reduction in size requires more than a mere demagnification of the various masks that are used to manufacture the circuits. Some modification of the circuit layout is usually required in order to affect a shrink, that modification usually being in the region of the pad ring 13. That is because the physical size of the pads themselves generally must remain the same, or cannot be shrunk as much as the rest of the circuit. Such a shrink of the FIG. 1A layout is shown in FIG. 1B where similar elements are identified by the same reference numbers but with a prime (') added. Enough pad area must remain for effecting a physical contact with a conductor that connects that pad with an external pin of a package in which the circuit chip is mounted. Integrated circuit packaging technology is not allowing the pads to be reduced in size as much as process technology is allowing the remaining portions of the circuit to be shrunk. The result is that circuit elements in the pad ring 13 must be rearranged in order to accommodate the relatively larger size pads that result after the overall circuit layout size is reduced.

In addition, the structure of circuit elements in the pad ring area 13 can be updated, examples of this being in connection with e ectrostatic discharge protection circuits provided with each pad and any CMOS latch-up circuits. This allows any improvements in technology of these types of circuits to be incorporated into the new chip.

There are often additional changes that may become necessary or desirable as a result of a circuit shrink that affects the core portion 15 of the circuit. One such change that often may be made is to increase the width of the power line conductors. A shrink may leave the conductors too narrow to satisfactorily carry the amount of current required of them. Another possible change is to add a layer of metal to the circuit for interconnecting various portions of it. Such interconnections can replace more space consuming interconnections that exist or are provided in other layers of the existing circuit layout design.

There are other changes and improvements, not directly related to the process of shrinking the size of the circuit, which may desirably be made at the time of a shrink, or at any other time if it becomes necessary. One such change is to reroute conductors that carry critical signals in order to reduce their path length and thus reduce the signal delay over those conductors. This improvement allows the circuit performance to keep up with increasing speeds of operation of systems in which the circuit is utilized. Another possible change is to alter the aspect ratio of the chip layout in order to be compatible with new packaging.

In the process of making the layout changes of the types discussed above, transistors and other elements of the circuit must be moved around. It is this rearrangement that raises the potential of the layout designer making a mistake and inadvertently altering the underlying electronic circuit. For the most part, the changes discussed above do not involve changing the underlying electronic circuit schematic but rather involve changes to the positioning of circuit components of that schematic from the positions originally selected in an existing layout of that circuit.

Figure 2:
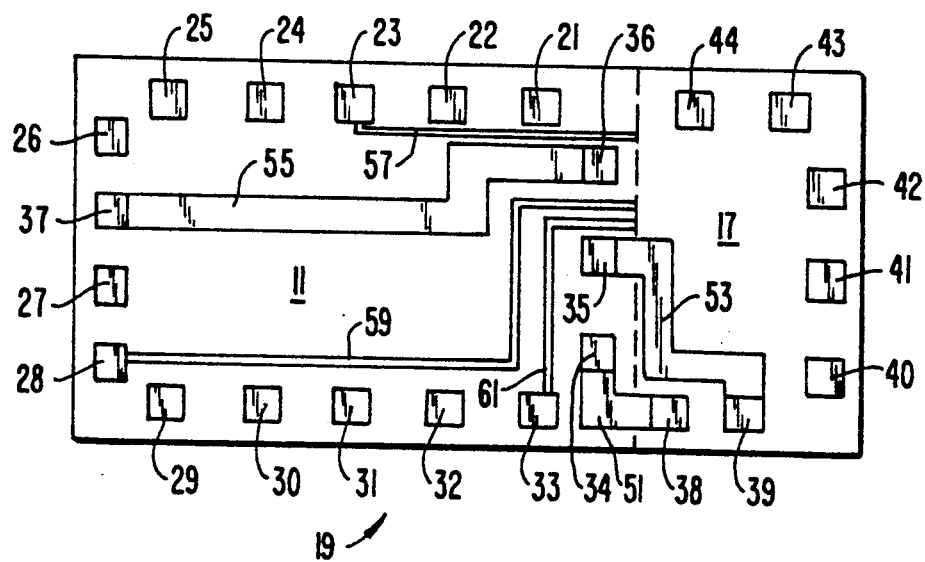
FIG. 2 is an integrated circuit layout that shows another example modification of the layout of FIG. 1A; and, FIG. 3 is a flow diagram that illustrates the improved process of the present invention in order to verify such modifications.

Another example where similar types of layout editing is necessary is illustrated in FIG. 2. This FIGURE illustrates the combining of the circuit 11 with another circuit 17 to form a single chip 19. Such combinations are becoming quite popular in order to provide integrated circuits for specific applications. For example, if the circuit layout 11 is of a microprocessor, it can be combined with a layout 17 for an input/output circuit or a math co-processor. Such functions have been most commonly provided on separate integrated circuit chips. Of course, if they can be combined into a single chip, the total number of I.C. packages required for a given electronic system is reduced.

As part of readying the circuit layout 11 for combining with the circuit layout 17, many of the layout changes discussed above with respect to FIG. 1A also need to be accomplished. In addition, other layout changes need to be made in order to accommodate the joining of the two circuits together. Changes in the example of FIG. 2 include effectively moving the pads 34, 35, and 36 to positions along the edge of the combined chip layout 19. Further, at least some of the pads of the circuit layout 11 need to be electrically connected with points within the circuit layout 17 so that the two circuits will work together.

In the example of FIG. 2, these additional changes are accomplished by adding another metal layer to the structure of the chip so that various interconnections may be made without having to disturb the layout of the remaining layers of the chip. This can easily be done where the layout design of the circuit 11 has been accomplished with only a single metal layer. This additional metal layer is used to extend the pad 34 to another pad 38 at an edge of the circuit chip 19 by a wide conductor 51. Similarly, pad 35 is moved to a position 39 by a conductor 53. The pads of the circuit 11 along the edge adjacent the new circuit 17 need not all be moved into the circuit area 17, however, but can be moved to locations along the remaining outside edges of the circuit 11 by rearranging its pads. This is illustrated by the pad 36 being moved to a new pad location 37 and interconnected with a conductor 55. In order to make room for the new pad 37, the pads 26, 27 and 28 have to be moved. This movement causes significant rearrangement of circuit elements formed by other layers of the layout 11, and thus introduces the possibility of inadvertent changes in the circuit schematic being made by this operation. The conductors 51, 53 and 55 are made to be relatively wide, in this example, since they are carrying output signals.

In addition to moving these pads, some or all of the pads of the circuit 11 need to be electrically extended into and connected with portions of the new circuit 17. Three such interconnections are shown being made by this new metal layer, namely by conductors 57, 59 and 61. And, of course, the new circuit 17 has its own pads 40-44 that must be provided around the outside edge of the layout 19.

There are many situations where a layout designer will have very little documentation and other information about the circuit 11 other than the layout itself as expressed in a standard computer database. For older circuits, the documentation of schematics and the like is lost or acquisition of rights in circuits from other companies may not include the transfer of complete documentation. Thus, in such situations, a layout designer wants to operate very slowly and carefully in order to avoid inadvertently making changes to the underlying circuit schematic which is not available for reference. This concern also inhibits very extensive changes being made to the layout for fear of making such errors. Any undesired changes made to the underlying circuit schematic will not be detected until the circuit is implemented in silicon. It is very expensive when a layout design cannot be verified prior to physically building the circuit.

Figure 3:
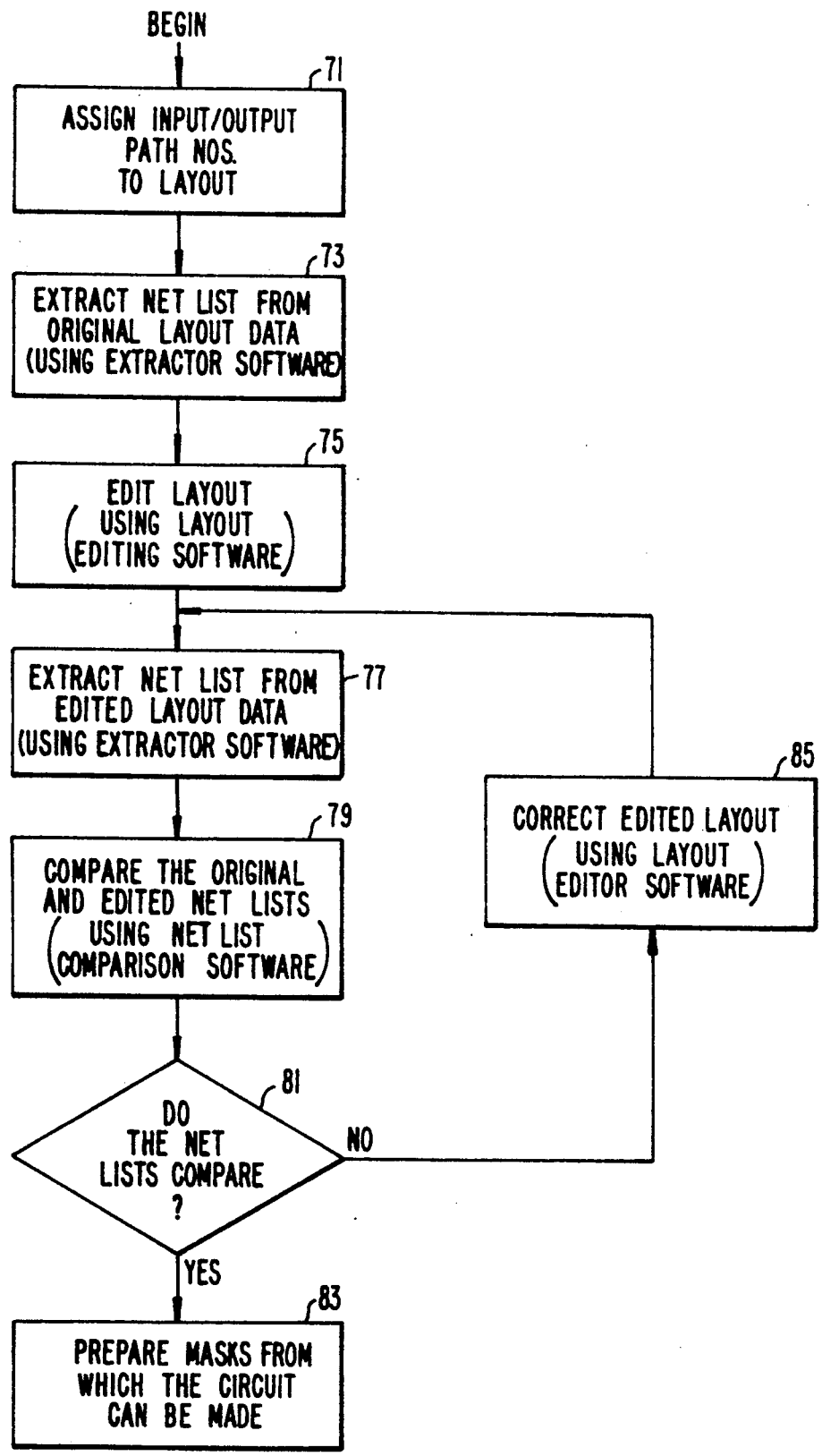

Therefore, according to the present invention, a process is utilized with such existing circuits, using available computer program software tools, to allow such verification as part of editing an existing layout. This process is illustrated in FIG. 3, in the form of a flow diagram.

The layout database for the circuit 11 is initially run through net list extractor software in order to obtain a net list of the circuit implemented by the layout before any editing of the layout occurs. This is illustrated in FIG. 3 by steps 71 and 73. A first step 71 involves assigning specific designations to the various input and output connections of the circuit 11. These designations are then inputted into the net list extractor software that is run in step 73.

A next step 75 is the editing of the layout from the original layout computer database. A standard layout editing software package is used in this process. This is the point at which the circuit element rearrangements, addition of other layers, etc., of the circuit layout 11 are accomplished.

After all of the editing of the layout is completed, a next step 77 is to run the edited layout database through the net list extractor software again. This results in a net list of the edited layout which is then, in a step 79, compared to the net list obtained in step 73. This comparison is accomplished by using an existing net list comparison computer software package. Before comparison, however, it may be desirable to alter the databases somewhat to eliminate portions of the layout which are not part of the circuit being implemented, such as company logo, test circuits, alignment keys and the like.

The results of the comparison of step 79 give a list of any differences in the two net lists. If there are no differences that relate to the circuit being implemented, as reviewed at a decision point 81, the edited layout database is then known to be free of any inadvertent errors made in the schematic diagram during the editing process. A next step 83 is to utilize this edited database to make the plurality of masks that are used in the process of making the integrated circuit on a silicon wafer.

However, if at step 81 it is determined that some errors have been introduced into the layout, the exact nature of each error is investigated and corrected in a step 85 by further use of the layout editor computer software package. Once the corrections are made, steps 77 and 79 are again performed on the corrected edited layout database.

There are several commercial software packages available that can be used in this process. Examples are the software packages sold by VLSI Technology, Inc. That company has available all of the net list extractor, layout editing and net list software packages that may be used in the layout editing process described with respect to FIG. 3.

Although the present invention has been described with respect to a preferred implementation thereof, it will be understood that the invention is entitled to protection within the full scope of the appended claims.

We claim:

1. A method of modifying the layout of an existing integrated circuit from a computer database of the layout without altering an electronic circuit that is implemented by the layout, comprising the steps of:
   obtaining a net list of the electronic circuit by running an extraction computer software program on the layout database,
   subsequently modifying the layout by using a layout editor computer software program to edit the layout database,
   thereafter obtaining a net list of the modified layout by running the extraction computer software program on the edited layout database,
   identifying any differences between the two net lists by running a net list comparison software program on data of the two net lists, thereby to determine whether modification of the layout has been accomplished without modifying the electronic circuit being implemented by it, and
   if the net list is not changed, utilizing said edited database to make a plurality of masks whereby the integrated circuit can be manufactured from said plurality of masks.

2. The method according to claim 1 wherein the step of modifying the layout includes editing the layout database in order to shrink the overall size of the layout.

3. The method according to claim 1 wherein the step of modifying the layout includes editing the layout database in a manner that allows combining the layout with another layout to create a single integrated circuit.

4. A method of making integrated circuit layout masks from which the circuit can be manufactured, comprising the steps of:
   obtaining a computer database of an existing integrated circuit layout that implements a particular electronic circuit,
   generating a net list of the electronic circuit by running an extraction computer software program on the layout database,
   subsequently modifying the layout by using a layout editor computer software program to edit the layout database,
   thereafter obtaining a net list of the modified layout by running the extraction computer software program on the edited layout database,
   identifying any material differences between the two net lists by running data of the two net lists on a net list comparison computer software program, thereby to determine whether modification of the layout has caused any changes to be made in the electronic circuit being implemented by it,
   editing the modified layout database to eliminate any such material differences, and
   thereafter utilizing the modified layout database to make a set of masks that identify various layer layouts of the integrated circuit, whereby the integrated circuit can be manufactured from the mask set.

5. The method according to claim 4 wherein the step of modifying the layout includes editing the layout database in order to shrink the overall size of the layout.

6. The method according to claim 4 wherein the step of modifying the layout includes editing the layout database in a manner that allows combining the layout with another layout to create a single integrated circuit.

* * * * *